(12) United States Patent
Kitabayashi (10) Patent No.: US 11,291,107 B2
(45) Date of Patent: Mar. 29, 2022

(54) SEMICONDUCTOR DEVICE

(71) Applicant: Mitsubishi Electric Corporation, Tokyo (JP)

(72) Inventor: Takuya Kitabayashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/173,775

(22) Filed: Feb. 11, 2021

(65) Prior Publication Data
US 2021/0360771 A1    Nov. 18, 2021

(30) Foreign Application Priority Data

May 14, 2020 (JP) .............................. JP2020-084857

(51) Int. Cl.
*H05K 1/02* (2006.01)
*H05K 1/11* (2006.01)
*H01L 23/00* (2006.01)

(52) U.S. Cl.
CPC ........... *H05K 1/0209* (2013.01); *H01L 24/48* (2013.01); *H05K 1/115* (2013.01)

(58) Field of Classification Search
CPC ............................ H05K 1/0209; H05K 1/115
USPC ......................................................... 361/704
See application file for complete search history.

(56) References Cited

U.S. PATENT DOCUMENTS

| | | | |
|---|---|---|---|
| 2007/0215996 A1* | 9/2007 | Otremba | H01L 23/4334 257/678 |
| 2008/0146010 A1* | 6/2008 | Hosseini | H01L 23/49524 438/575 |
| 2008/0265326 A1* | 10/2008 | Hebert | H01L 23/62 257/355 |
| 2015/0270194 A1* | 9/2015 | Otremba | H01L 23/49562 257/670 |
| 2016/0086876 A1* | 3/2016 | Otremba | H01L 23/4952 257/676 |
| 2016/0126154 A1* | 5/2016 | Hoehn | H01L 21/4853 257/693 |
| 2016/0343641 A1* | 11/2016 | Hori | H01L 24/11 |
| 2020/0126947 A1* | 4/2020 | Karasawa | H01L 23/544 |

FOREIGN PATENT DOCUMENTS

JP      2017-123358 A      7/2017

* cited by examiner

*Primary Examiner* — Sherman Ng
(74) *Attorney, Agent, or Firm* — Studebaker & Brackett PC (57) ABSTRACT

An object is to suppress the temperature rise of a semiconductor element due to the heat generation of a metal wire. A semiconductor device includes a printed circuit board including a first circuit pattern and a second circuit pattern, and a semiconductor element arranged on an upper surface of the first circuit pattern, in which, in the semiconductor element, a drain electrode is arranged on an upper surface thereof and a gate electrode and a source electrode are arranged on a lower surface thereof, the gate electrode and the source electrode are bonded to the upper surface of the first circuit pattern via a first bonding material, and the drain electrode is bonded to an upper surface of the second circuit pattern via a metal member connected to the upper surface of the semiconductor element.

9 Claims, 9 Drawing Sheets

SEMICONDUCTOR DEVICE

FIELD OF THE INVENTION

The technique disclosed in the specification of the present application relates to a semiconductor device. Description of the Background Art In a conventional semiconductor device, for example, a drain electrode of a semiconductor element is bonded to a circuit pattern on the upper surface of an insulating substrate with solder or the like, and a source electrode and a gate electrode of the semiconductor element are connected to a metal terminal or the like via a metal wire consists of Al or Cu or the like.

Meanwhile, a reduction in size of a semiconductor element is under progress for the reduction of the production cost, and the areas the metal wires of the gate electrode and the source electrode to be bonded on are becoming smaller.

When the areas where the metal wires of the gate electrode and the source electrode to be bonded on decrease, the number of metal wires to be wired to the source electrode decreases, so that the amount of heat generated by each metal wire increases. Consequently, the temperature of the semiconductor element rises due to the heat transfer from the metal wire in many cases.

For example, the technique disclosed in Japanese Patent Application Laid-Open No. 2017-123358 is a technique for dealing with such a problem, in which the heat radiation efficiency is improved a lateral semiconductor element such as a GaN-high electro mobility transistor (HEMT).

SUMMARY

However, the technique disclosed in Japanese Patent Application Laid-Open No. 2017-123358 relates to a lateral semiconductor element in which a source electrode and a drain electrode are arranged in a direction parallel to a substrate, which has had the problem that the technique is inapplicable to other semiconductor elements such as a vertical semiconductor element in which a source electrode and a drain electrode are arranged in a direction perpendicular to a substrate.

A technique disclosed in the present specification is a technique for suppressing a temperature rise of a semiconductor element due to heat generation of a metal wire or the like.

A first aspect of the technique relating to the semiconductor device disclosed in the present specification includes a printed circuit board including a first circuit pattern and a second circuit pattern, and a semiconductor element arranged on an upper surface of the first circuit pattern, in which, in the semiconductor element, a drain electrode is arranged on an upper surface thereof and a gate electrode and a source electrode are arranged on a lower surface thereof, the gate electrode and the source electrode are bonded to the upper surface of the first circuit pattern via a first bonding material, and the drain electrode is bonded to an upper surface of the second circuit pattern via a metal member connected to the upper surface of the semiconductor element.

According to the first aspect of the technique disclosed in the present specification, the temperature rise of the semiconductor element is suppressed.

These and other objects, features, aspects and advantages of the present invention will become more apparent from the following detailed description of the present specification when taken in conjunction with the accompanying drawings.

DESCRIPTION OF THE PREFERRED EMBODIMENTS

Hereinafter, Embodiments will be described with reference to the attached drawings. Although, in the following Embodiments, detailed features and the like are also described for the purpose of explaining the technique, the features are examples, and not all of them are necessarily essential features in order for Embodiments to be feasible. It should be noted that the drawings are schematically illustrated and, therefore, the configuration is, appropriately omitted or simplified for facilitating the description. Also, the mutual relationship among sizes and positions in configurations and the like illustrated in respective drawings are not necessarily accurately described, and may be changed as appropriate. In addition, in the drawings such as plan views that are not cross-sectional views, hatching may be given to facilitate understanding of the contents of Embodiments.

In addition, in the following description, the same components are denoted by the same reference numerals, and the names and functions thereof are also similar. Accordingly, detailed descriptions thereof may be omitted to avoid redundancy.

Also, in the following description, when it is described that a certain component "is provided with", "includes", or "has", it does not express to exclude the existence of other components unless otherwise specified.

Also, in the following description, even though ordinal numbers such as "first", and "second" may be used, these terms are for promoting the understanding of the contents of Embodiments and are not for defining the order caused by such ordinal numbers.

Also, in the following description, even though terms indicating specific positions or directions such as "upper", "lower", "left", "right", "side", "bottom", "front", and "back" may be used, these terms are for promoting the understanding of the contents of Embodiments and are not related to the positions or the directions at the time of implementation.

Further, in the description described below, when "the upper surface of . . . " or "the lower surface of . . . " is described, the description includes such a state in which other components are formed on the upper surface or the lower surface of a subject component in addition to the upper surface per se or the lower surface per se of the subject component. That is, for example, when the description "the component B provided on the upper surface of the component A" is made, the description does not exclude the interposition of another component C between the component A and the component B.

Embodiment 1

Hereinafter, a semiconductor device according to Embodiment 1 will be described.

Further, in the following description, the expression "A and B are electrically connected" indicates that a current can flow in both directions between the configuration A and the configuration B.

<Configuration of Semiconductor Device>

Figure 1:
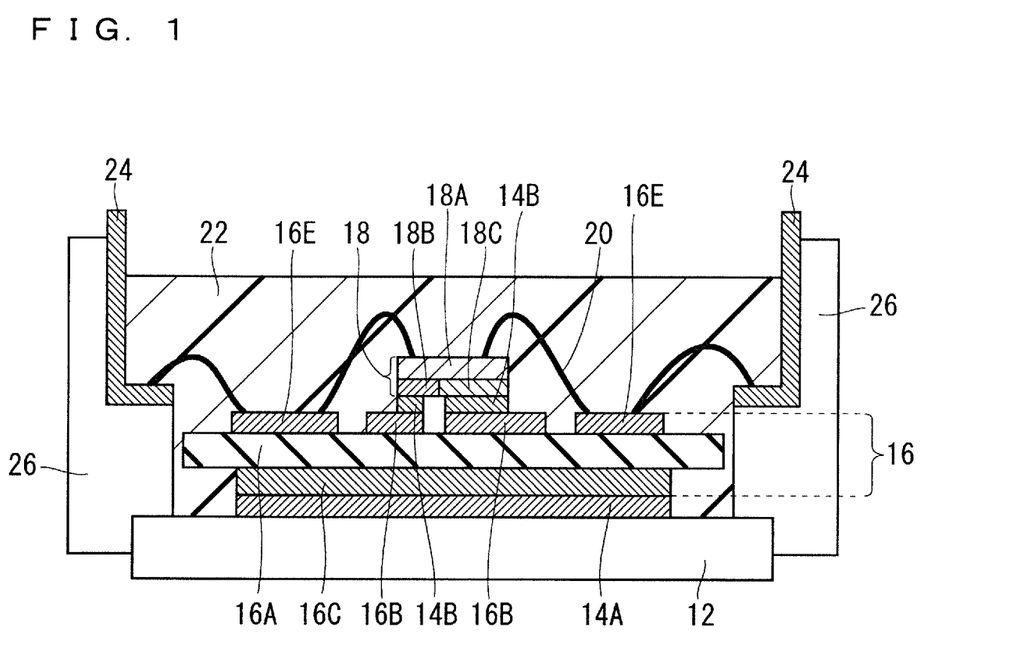
FIG. 1 is a cross-sectional view schematically illustrating a configuration example of a semiconductor device according to Embodiment 1.

FIG. 1 is a cross-sectional view schematically illustrating a configuration example of a semiconductor device according to Embodiment 1.

As the example illustrated in FIG. 1, the semiconductor device includes at least a printed circuit board 16 and a semiconductor element 18 bonded to the upper surface of the printed circuit board 16 via a conductive bonding material 14B.

Here, the printed circuit board 16 includes an insulating substrate 16A, a circuit pattern 16B and a circuit pattern 16E formed on the upper surface of the insulating substrate 16A, and a circuit pattern 16C formed on the lower surface of the insulating substrate 16A.

Further a semiconductor element 18 is an field effect transistor including a metal-oxide-semiconductor field-effect transistor, or MOSFET, a junction field effect transistor, or JFET, an insulated gate bipolar transistor, or IGBT, a high electron mobility transistor, or HEMT, or the like, and the semiconductor element 18 includes a drain electrode 18A arranged on the upper surface and a gate electrode 18B arranged on the lower surface connected to the circuit pattern 16B via the bonding material 14B, and a source electrode 18C arranged on the lower surface connected to the circuit pattern 16B via the bonding material 14B. Further, the semiconductor element 18 consists of, for example, Si. When an IGBT is used as the semiconductor element 18, the source electrode in the above description is replaced with an emitter electrode of the IGBT, and the drain electrode in the above description is replaced with a collector electrode of the IGBT.

Further, the semiconductor device is capable of further including a base plate 12 bonded to the lower surface of the printed circuit board 16 via the conductive bonding material 14A, a metal wire 20 connecting the drain electrode 18A and the circuit pattern 16E, a metal terminal 24 further connected to the circuit pattern 16E with the metal wire 20, a case 26 accommodating these components, and a sealing material 22 such as gel or an epoxy resin filled in the case 26. The lower surface of the base plate 12 is exposed to the outside below the case 26.

The drain electrode 18A is formed on the upper surface of the semiconductor element 18 to which the metal wire 20 is connected, with this configuration, an area where the metal wire is bonded is made larger than in a case in which the metal wire 20 is connected to the surface on which the gate electrode 18B and the source electrode 18C are formed which is the upper surface.

Accordingly, the number of metal wires 20 to be wired on the surface increases; therefore, the amount of heat generated by each metal wire 20 is suppressed. In addition, the degree of freedom in the wiring position of the metal wires 20 is enhanced. As a result, even if the outer diameter size of the semiconductor element 18 is reduced, the temperature rise of the semiconductor element 18 due to the heat of the metal wires 20 is suppressed.

Further, the source electrode 18C is connected to the circuit pattern 16B via the bonding material 14B; therefore, the temperature rise of the semiconductor element 18 is suppressed more than that in the case where the source electrode 18C is connected by the metal wire 20.

Figure 2:
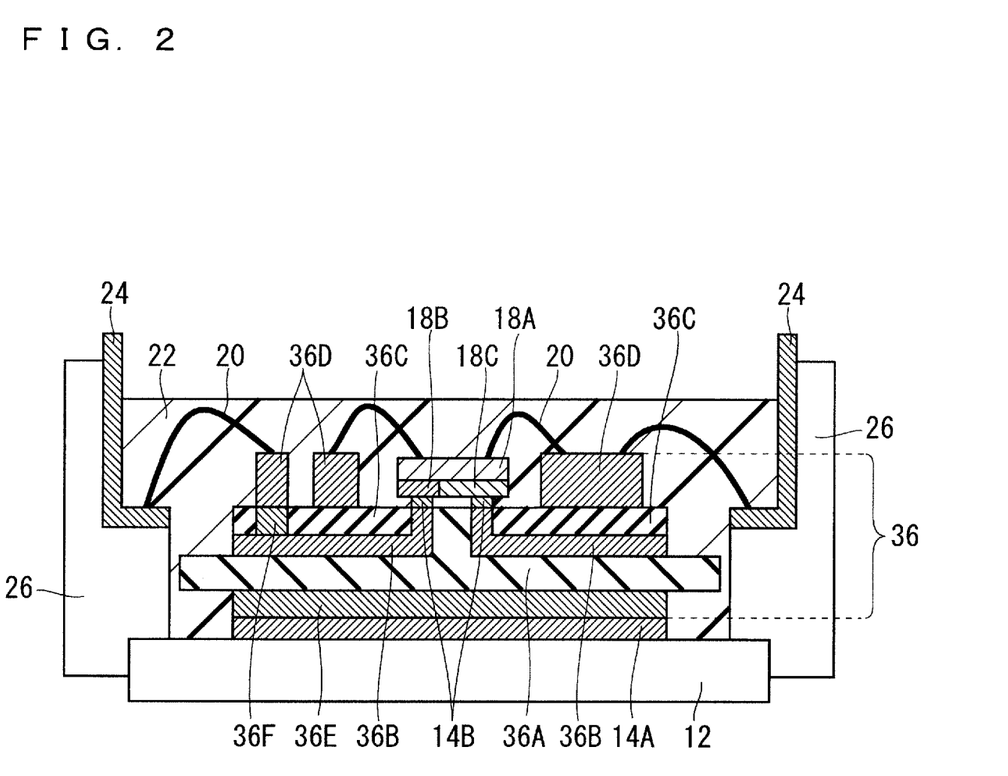
FIG. 2 is a cross-sectional view schematically illustrating a Modification example of a configuration of the semiconductor device according to Embodiment 1.

FIG. 2 is a cross-sectional view schematically illustrating a Modification example of a configuration of the semiconductor device according to Embodiment 1.

As the example illustrated in FIG. 2, the semiconductor device includes at least a printed circuit board 36 and a semiconductor element 18 bonded to the upper surface of the printed circuit board 36 via a conductive bonding material 14B.

Here, the printed circuit board 36 includes an insulating substrate 36A, an wiring layer 36B formed on the upper surface of the insulating substrate 36A, an insulating layer 36C partially formed on the upper layer of the wiring layer 36B, a circuit pattern 36D formed on the upper layer of the insulating layer 36C, and a circuit pattern 36E formed on the lower layer of the insulating substrate 36A. The wiring layer 36B and the circuit pattern 36D are electrically connected via a connection layer 36F.

The semiconductor element 18 includes the drain electrode 18A arranged on the upper surface, the gate electrode 18B connected to the wiring layer 36B (that is, the circuit pattern on the upper surface of the printed circuit board 36) exposed from the insulating layer 36C via the bonding material 14B, and the source electrode 18C connected to the wiring layer 36B (that is, the circuit pattern on the upper surface of the printed circuit board 36) exposed from the insulating layer 36C via the bonding material 14B.

Further, the semiconductor device is capable of further including a base plate 12 bonded to the lower surface of the printed circuit board 36 via the conductive bonding material 14A, a metal wire 20 connecting the drain electrode 18A and the circuit pattern 36D, a metal terminal 24 further connected to the circuit pattern 36D with the metal wire 20, a case 26, and a sealing material 22. The lower surface of the base plate 12 is exposed to the outside below the case 26.

Here, the comparison is made between the structure in which a metal wire is connected to each of the gate electrode 18B and the source electrode 18C and the semiconductor device according to Embodiment 1.

Figure 3:
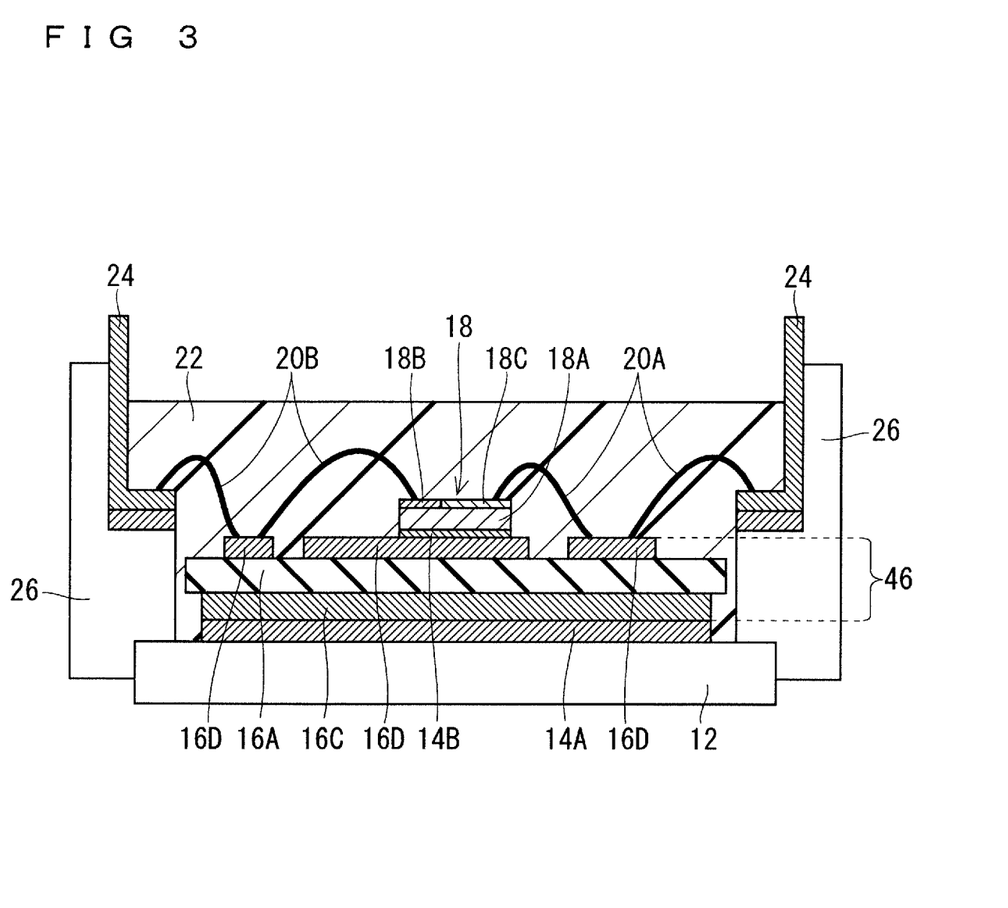
FIG. 3 is a cross-sectional view schematically illustrating a structural example in which a metal wire is connected to each of a gate electrode and a source electrode.

FIG. 3 is a cross-sectional view schematically illustrating a structural example in which a metal wire is connected to each of a gate electrode and a source electrode.

As the example illustrated in FIG. 3, the semiconductor device includes at least a printed circuit board 46 and a semiconductor element 18 bonded to the upper surface of the printed circuit board 46 via a conductive bonding material 14B.

Here, the printed circuit board 46 includes an insulating substrate 16A, a circuit pattern 16D formed on the upper surface of the insulating substrate 16A, and a circuit pattern 16C formed on the lower surface of the insulating substrate 16A.

Further, the semiconductor element 18 includes the drain electrode 18A connected to the circuit pattern 16D via the bonding material 14B, the gate electrode 18B, and the source electrode 18C.

Further, the semiconductor device is capable of further including a base plate 12 bonded to the lower surface of the printed circuit board 46 via the conductive bonding material 14A, a metal wire 20B connecting a gate electrode 18B and a circuit pattern 16D, a metal wire 20B connecting a source electrode 18C and a circuit pattern 16D, a metal terminal 24 further connected to the circuit pattern 16D with the metal wire 20A or the metal wire 20B, a case 26 accommodating these components, and a sealing material 22 such as gel or an epoxy resin filled in the case 26. The lower surface of the base plate 12 is exposed to the outside below the case 26.

Figure 4:
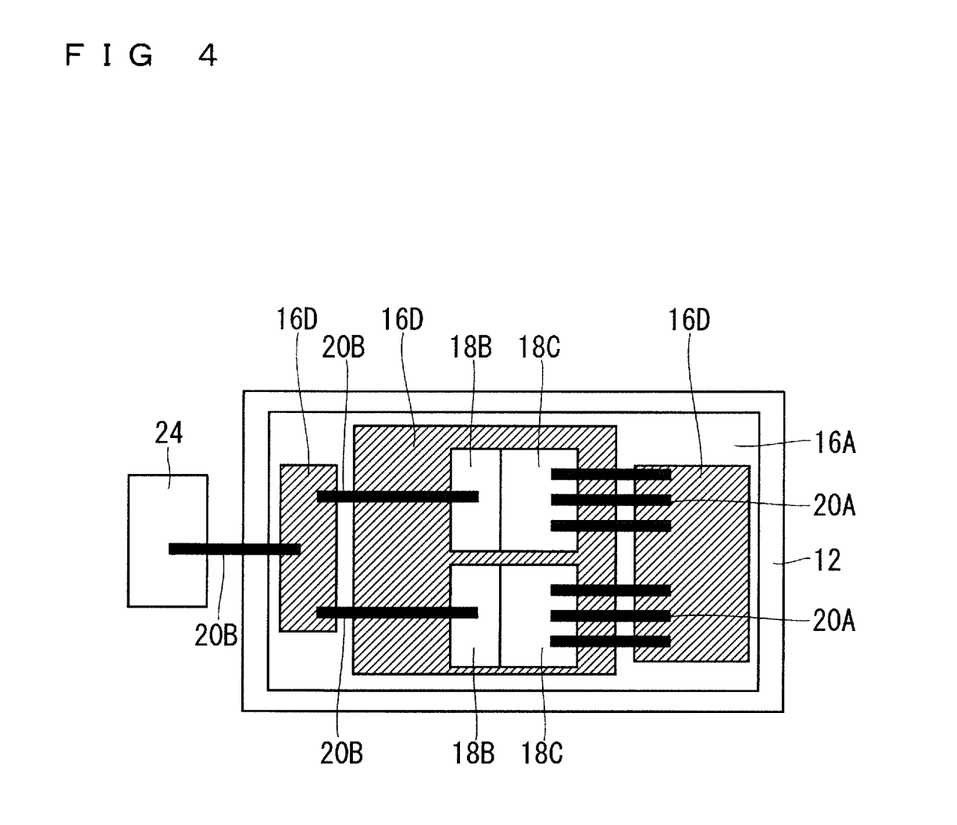
FIG. 4 is a plan view schematically illustrating a structural example when the metal wire is connected to each of the gate electrode and the source electrode.

FIG. 4 is a plan view schematically illustrating a structural example in which a metal wire is connected to each of the gate electrode 18B and the source electrode 18C.

As illustrated in FIG. 4, the metal wire 20B connected to the gate electrode 18B and the metal wire 20A connected to the source electrode 18C are respectively laid as wiring for controlling a plurality of semiconductor elements 18. Along with this, the area required for bonding the wiring increases. In addition, the degree of freedom in wiring is lowered.

Figure 5:
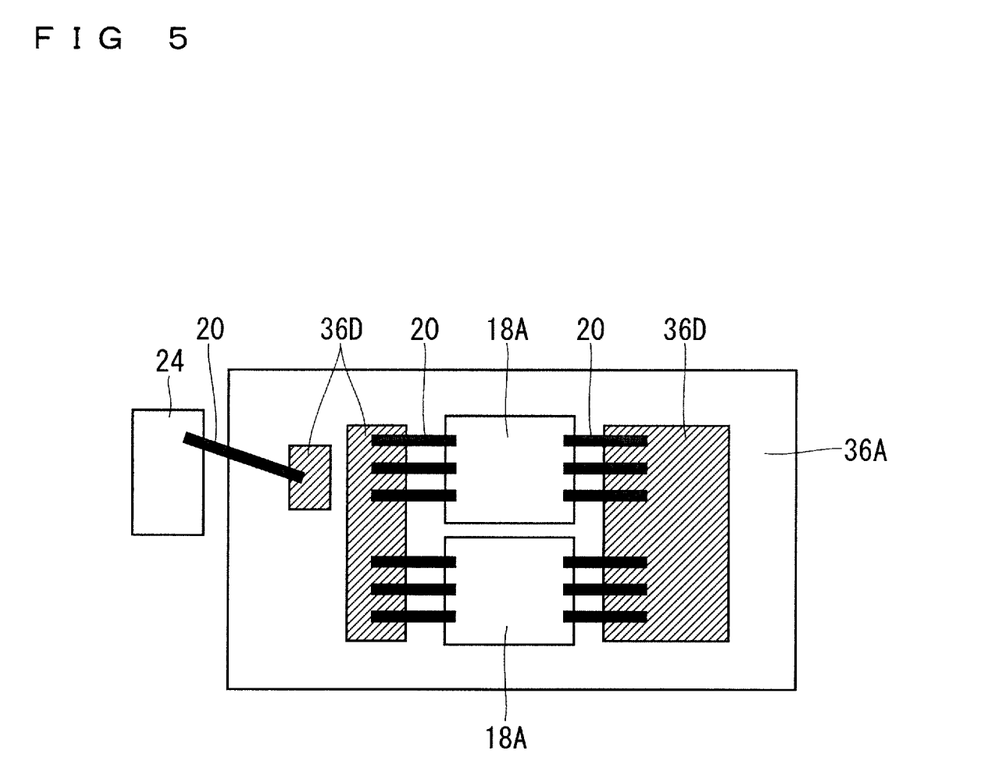
FIG. 5 is a plan view schematically illustrating the configuration example of the semiconductor device according to Embodiment 1.

FIG. 5 is a plan view schematically illustrating a configuration example of the semiconductor device according to Embodiment 1.

As illustrated in FIG. 5, the metal wire 20 connected to the drain electrode 18B is laid as wiring for controlling a plurality of semiconductor elements 18. On the other hand, the wiring layer 36B connected to the gate electrode 18B and the source electrode 18C functions as wiring for controlling a plurality of semiconductor elements 18 in the layer structure of the printed circuit board 36.

Therefore, in the example illustrated in FIG. 5, the reduction in the amount of wiring to be laid serving as the metal wire 20 for connection is ensured. Therefore, even if the outer diameter size of the semiconductor element 18 is reduced and a large number of semiconductor elements 18 are arranged in parallel, appropriate wiring with a high degree of freedom is performable without increasing the outer diameter size of the semiconductor device. As a result, the downsizing of the semiconductor device is implemented.

Embodiment 2

A semiconductor device according to Embodiment 2 will be described. In the following description, components similar to those described in above Embodiment will be illustrated with the same reference numerals, and detailed description thereof will be omitted as appropriate.

<Configuration of Semiconductor Device>

Figure 6:
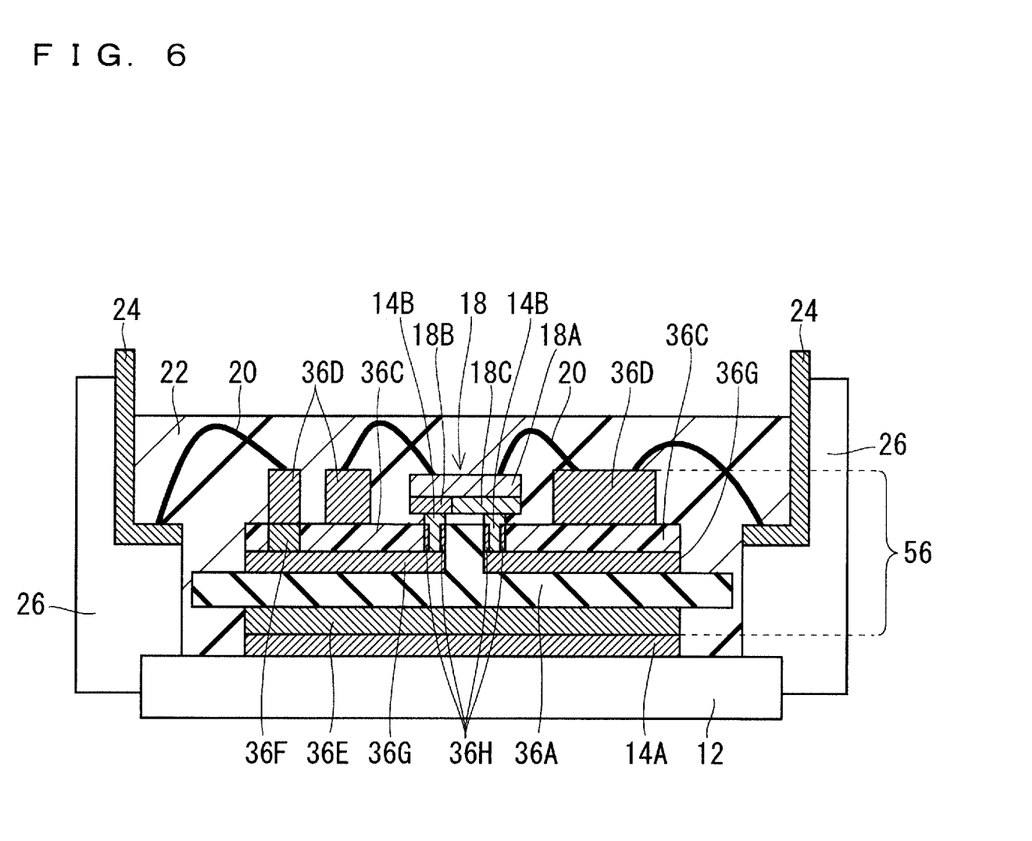
FIG. 6 is a cross-sectional view schematically illustrating a configuration example of a semiconductor device according to Embodiment 2.

FIG. 6 is a cross-sectional view schematically illustrating a configuration example of a semiconductor device according to Embodiment 2.

As the example illustrated in FIG. 6, the semiconductor device includes at least a printed circuit board 56 and a semiconductor element 18 bonded to the upper surface of the printed circuit board 56 via a conductive bonding material 14B.

Here, the printed circuit board 56 includes an insulating substrate 36A, a wiring layer 36G formed on the upper layer of the insulating substrate 36A, an insulating layer 36C partially formed on the upper layer of the wiring layer 36G, a circuit pattern 36D formed on the upper layer of the insulating layer 36C, and a circuit pattern 36E formed on the lower layer of the insulating substrate 36A. The wiring layer 36G includes a via hole plating layer 36H which is a plating layer formed on the inner wall of a via hole at a position where a gate electrode 18B and a source electrode 18C are bonded to the wiring layer 36G via the bonding material 14B. The wiring layer 36G and the circuit pattern 36D are electrically connected via a connection layer 36F. Further, the via hole plating layer 36H may be arranged at either one of a portion at which the wiring layer 36G is bonded to the gate electrode 18B or a portion at which the wiring layer 36G is bonded to the source electrode 18C.

The semiconductor element 18 includes a drain electrode 18A, the gate electrode 18B connected to the via hole plating layer 36H exposed from the insulating layer 36C via the bonding material 14B and further to the wiring layer 36G, the source electrode 18C connected to the via hole plating layer 36H exposed from the insulating layer 36C via the bonding material 14B and further to the wiring layer 36G.

Further, the semiconductor device is capable of further including a base plate 12 bonded to the lower surface of the printed circuit board 56 via a conductive bonding material 14A, a metal wire 20 connecting the drain electrode 18A and the circuit pattern 36D, a metal terminal 24 further connected to the circuit pattern 36D with the metal wire 20, a case 26, and a sealing material 22. The lower surface of the base plate 12 is exposed to the outside below the case 26.

In FIG. 6, each of the gate electrode 18B and the source electrode 18C is connected to the via hole plating layer 3611 and further to the wiring layer 36G via the bonding material 14B. Therefore, when the semiconductor element 18 and the printed circuit board 56 are bonded, the bonding material 14B penetrates into the via hole of the via hole plating layer 36H. Therefore, the bonding area between the bonding material 14B and the via hole plating layer 36H increases, enabling to stabilize the bonding process. Further, suppression of the heat generation in the wiring of the semiconductor element 18 is ensured; therefore, the reliability of the semiconductor element is improved.

Embodiment 3

A semiconductor device according to Embodiment 3 will be described. In the following description, components similar to those described in above Embodiments will be illustrated with the same reference numerals, and detailed description thereof will be omitted as appropriate.

<Configuration of Semiconductor Device>

Figure 7:
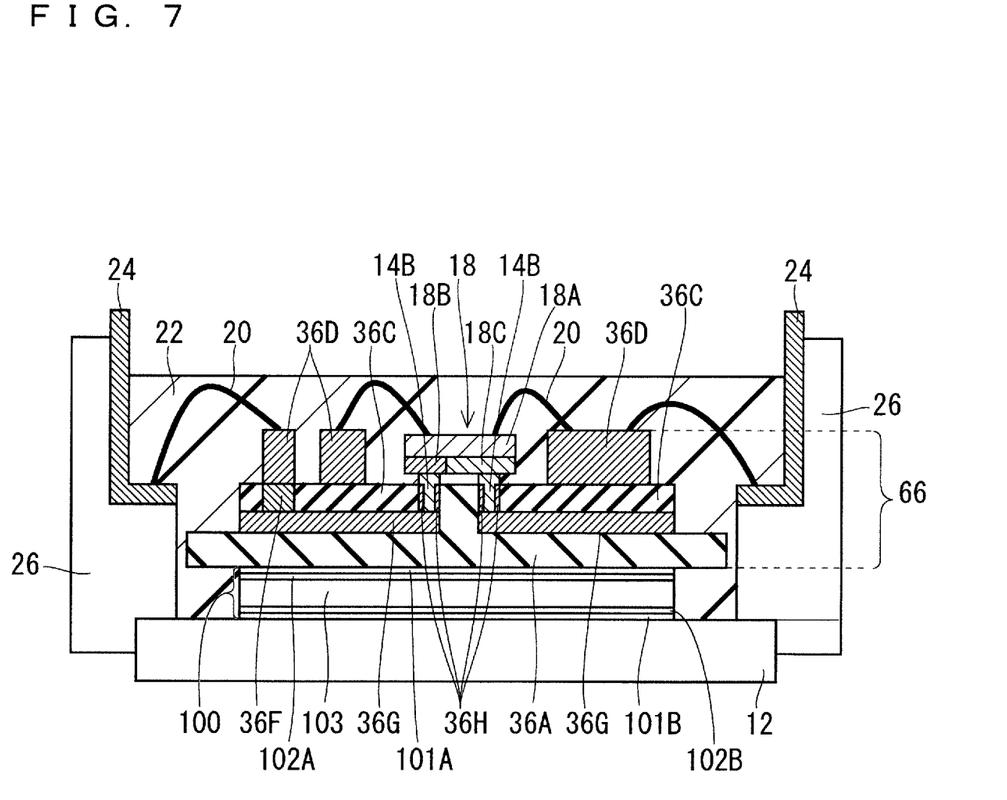
FIG. 7 is a cross-sectional view schematically illustrating a configuration example of a semiconductor device according to Embodiment 3.

FIG. 7 is a cross-sectional view schematically illustrating a configuration example of a semiconductor device according to Embodiment 3.

As the example illustrated in FIG. 7, the semiconductor device includes at least a printed circuit board 66 and a semiconductor element 18 bonded to the upper surface of the printed circuit board 66 via a conductive bonding material 14B.

Here, the printed circuit board 66 includes an insulating substrate 36A, a wiring layer 36G formed on the upper layer of the insulating substrate 36A, an insulating layer 36C partially formed on the upper layer of the wiring layer 36G, and a circuit pattern 36D formed on the upper layer of the insulating layer 36C. The wiring layer 36G includes a via hole plating layer 3611 provided at a position where a gate electrode 18B and a source electrode 18C are bonded to the wiring layer 36G via the bonding material 14B. The wiring layer 36G and the circuit pattern 36D are electrically connected via a connection layer 36F.

The semiconductor element 18 includes a drain electrode 18A, the gate electrode 18B connected to the via hole plating layer 36I1 exposed from the insulating layer 36C via the bonding material 14B and further to the wiring layer 36G, the source electrode 18C connected to the via hole plating layer 36I1 exposed from the insulating layer 36C via the bonding material 14B and further to the wiring layer 36G.

Further, the semiconductor device is capable of further including a base plate 12 adhered to the lower surface of a printed circuit board 56 via a heat radiation sheet 100, a metal wire 20 connecting the drain electrode 18A and the circuit pattern 36D, a metal terminal 24 further connected to the circuit pattern 36D with the metal wire 20, a case 26, and a sealing material 22. The lower surface of the base plate 12 is exposed to the outside below the case 26.

The radiation sheet 100 includes a polyethylene terephthalate (PET) film 102A, which adheres to the lower side of the insulating substrate 36A via an acrylic adhesive 101A, a graphite sheet 103 arranged on the lower surface of the PET film 102A, a PET film 102B arranged on the lower surface of the graphite sheet 103, and an acrylic adhesive 101B that adheres to the lower surface of the PET film 102B. The base plate 12 adheres to the lower surface of the acrylic adhesive 101B.

According to the structure illustrated in FIG. 7, the heat radiation property of the semiconductor element 18 is improved. Therefore, even if the outer diameter size of the semiconductor element 18 is reduced, deterioration of the heat radiation property of the semiconductor element 18 is suppressed by dispersing the heat generated in the semiconductor element 18 by the graphite sheet 103.

Embodiment 4

A semiconductor device according to Embodiment 4 will be described. In the following description, components similar to those described in above Embodiments will be illustrated with the same reference numerals, and detailed description thereof will be omitted as appropriate.

<Configuration of Semiconductor Device>

Figure 8:
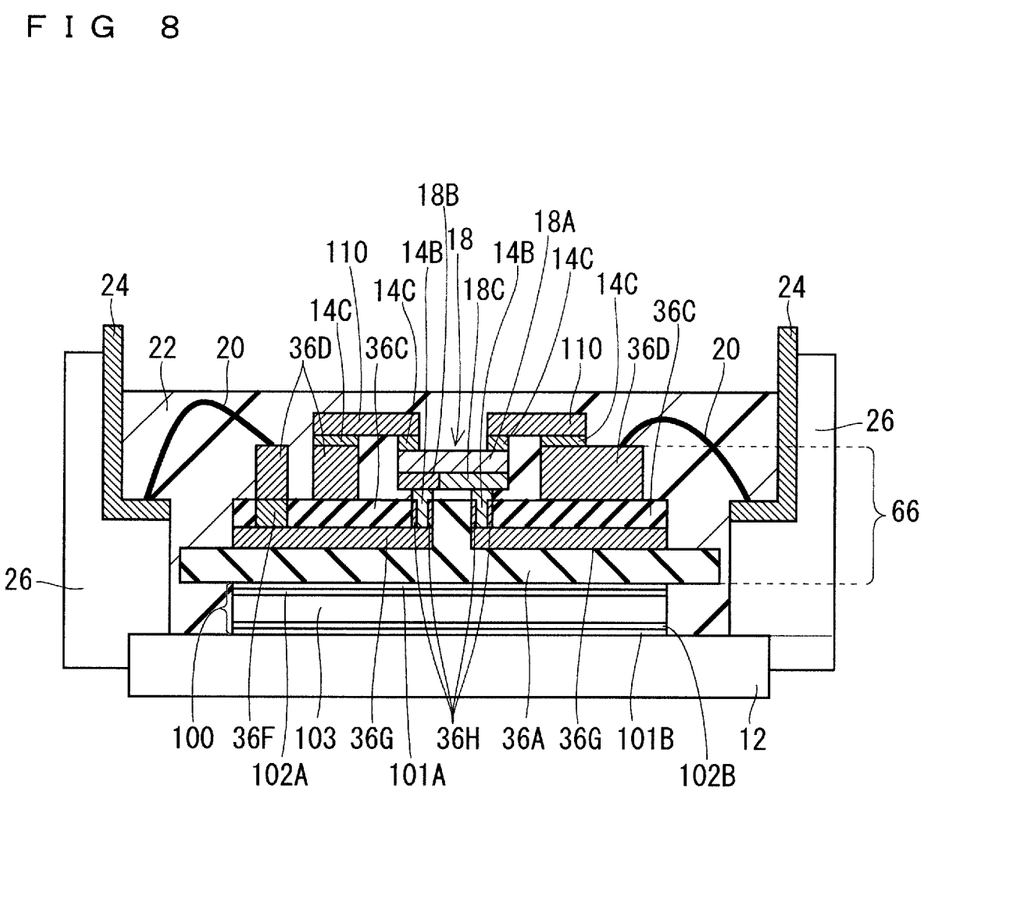
FIG. 8 is a cross-sectional view schematically illustrating a configuration example of a semiconductor device according to Embodiment 3.

FIG. 8 is a cross-sectional view schematically illustrating a configuration example of a semiconductor device according to Embodiment 4.

As the example illustrated in FIG. 8, the semiconductor device includes at least a printed circuit board 66 and a semiconductor element 18.

Further, the semiconductor device is capable of further including a base plate 12 adhered to the lower surface of the printed circuit board 66 via a heat radiation sheet 100, a metal block 110 connecting a drain electrode 18A and a circuit pattern 36D via a bonding material 14C, a metal terminal 24 connected to the circuit pattern 36D with a metal wire 20, a case 26, and a sealing material 22. The lower surface of the base plate 12 is exposed to the outside below the case 26.

The radiation sheet 100 includes an acrylic adhesive 101A, a PET film 102A, a graphite sheet 103, a PET film 102B, and an acrylic adhesive 101B. The base plate 12 adheres to the lower surface of the acrylic adhesive 101B.

According to the structure illustrated in FIG. 8, the metal block 110 connected to the drain electrode 18A and the circuit pattern 36D has a larger bonding area than the metal wire; therefore, the heat radiation property of the semiconductor element 18 is improved. As a result, a design that increases the current density of the semiconductor element 18 is implemented.

Embodiment 5

A semiconductor device according to Embodiment 5 will be described. In the following description, components similar to those described in above Embodiments will be illustrated with the same reference numerals, and detailed description thereof will be omitted as appropriate.

<Configuration of Semiconductor Device>

Figure 9:
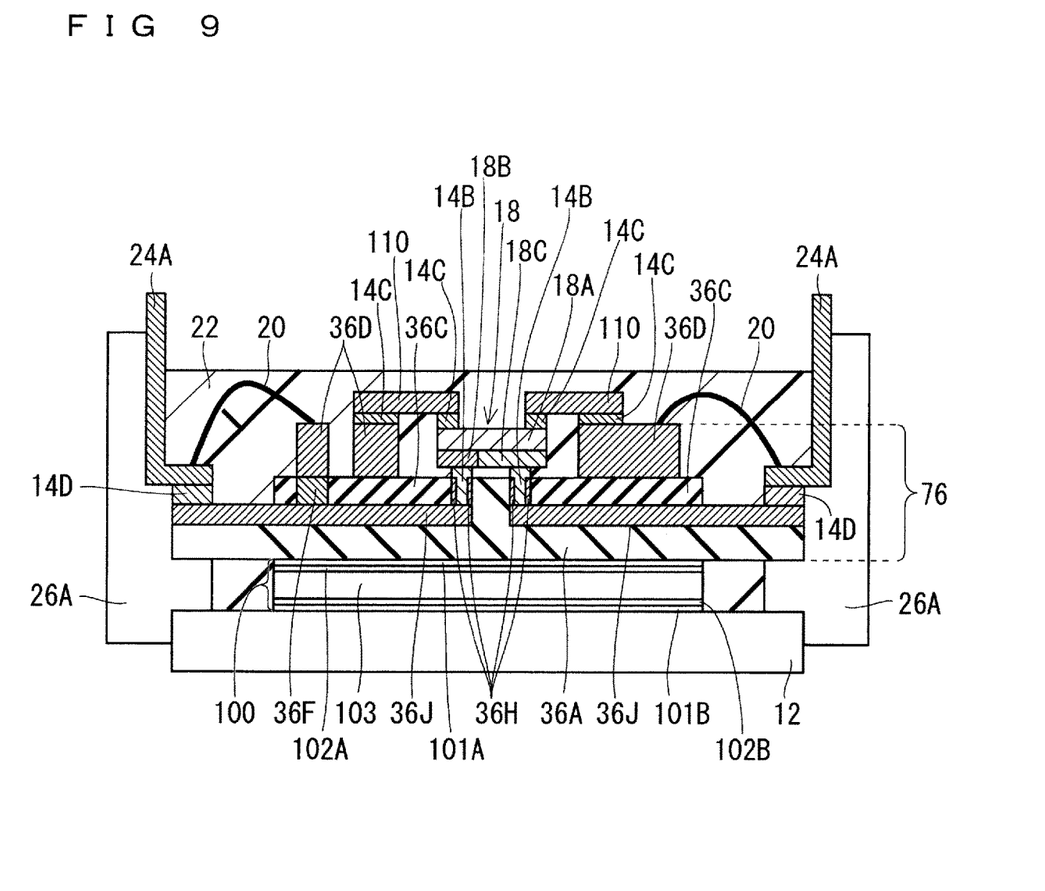
FIG. 9 is a cross-sectional view schematically illustrating a configuration example of a semiconductor device according to Embodiment 5.

FIG. 9 is a cross-sectional view schematically illustrating a configuration example of a semiconductor device according to Embodiment 5.

As the example illustrated in FIG. 9, the semiconductor device includes at least a printed circuit board 76 and a semiconductor element 18 bonded to the upper surface of the printed circuit board 76 via a conductive bonding material 14B.

Here, the printed circuit board 76 includes an insulating substrate 36A, an wiring layer 36J formed on the upper layer of the insulating substrate 36A, an insulating layer 36C partially formed on the upper layer of the wiring layer 36J, and a circuit pattern 36D formed on the upper layer of the insulating layer 36C. The wiring layer 36J includes a via hole plating layer 36H provided at a position where a gate electrode 18B and the source electrode 18C are bonded to the wiring layer 36J via the bonding material 14B. The wiring layer 36J and the circuit pattern 36D are electrically connected via a connection layer 36F.

The semiconductor element 18 includes a drain electrode 18A, the gate electrode 18B connected to the via hole plating layer 36H exposed from the insulating layer 36C via the bonding material 14B and further to the wiring layer 36J, the source electrode 18C connected to the via hole plating layer 36I1 exposed from the insulating layer 36C via the bonding material 14B and further to the wiring layer 36J.

Further, the semiconductor device is capable of further including a base plate 12 adhered to the lower surface of a printed circuit board 76 via a heat radiation sheet 100, a metal block 110 connecting the drain electrode 18A and the circuit pattern 36D via a bonding material 14C, a metal terminal 24A connected to the wiring layer 36J exposed on the side of the insulating layer 36C via a bonding material 14D, a case 26A, and a sealing material 22. The lower surface of the base plate 12 is exposed to the outside below the case 26A.

The radiation sheet 100 includes an acrylic adhesive 101A, a PET film 102A, a graphite sheet 103, a PET film 102B, and an acrylic adhesive 101B. The base plate 12 adheres to the lower surface of the acrylic adhesive 101B.

According to the structure illustrated in FIG. 9, the metal terminal 24A and the wiring layer 36J are connected via the bonding material 14D; therefore, the necessity to form a pattern for connecting the metal wires is eliminated. Therefore, a large area for mounting the semiconductor element 18 is secured, and the downsizing of the semiconductor device is implemented.

Embodiment 6

A semiconductor device according to Embodiment 6 will be described. In the following description, components similar to those described in above Embodiments will be illustrated with the same reference numerals, and detailed description thereof will be omitted as appropriate.

<Configuration of Semiconductor Device>

The semiconductor device described in Embodiment 6 is capable of including a printed circuit board having Tj=175° C. or higher and the peeling intensity at 175° C. or higher is 70% or more of the peeling intensity at room temperature.

By providing a printed circuit board made of a resin material having heat resistance as described above, the reliability of the semiconductor device in a high temperature environment is improved.

Embodiment 7

A semiconductor device according to Embodiment 7 will be described. In the following description, components similar to those described in above Embodiments will be illustrated with the same reference numerals, and detailed description thereof will be omitted as appropriate.

<Configuration of Semiconductor Device>

The semiconductor device described in Embodiment 7 is capable of including a semiconductor element 18 consisting of silicon carbide (SiC). Here, silicon carbide (SiC) is a type of wide-gap semiconductor. Wide-gap semiconductors typically indicate semiconductors with a forbidden bandgap of approximately 2 eV or higher and known wide-gap semiconductors include a group 3 nitride such as gallium nitride (GaN), a group 2 oxide such as zinc oxide (ZnO), a group 2 chalcogenide such as zinc selenide, diamond, and silicon carbide.

When the semiconductor element provided in the semiconductor device consists of SiC, the downsizing and the multiple parallelization of the semiconductor elements are implemented due to the property of SiC of being capable of operation at a higher temperature than that of Si or the like. As a result, the downsizing of the semiconductor device is implemented.

Effects Produced by Embodiments Described Above

Next, an example of the effects produced by Embodiments described above will be described. Although, in the following description, the effects are described based on the specific configuration illustrated in Embodiments described above, the specific configuration may be replaced, within the scope where the same effects are produced, with other specific configuration of which example will be illustrated in the present specification.

Further, the replacement may be delivered across a plurality of Embodiments. That is, it may be the case that the respective configurations illustrated in the examples in different Embodiments are combined to produce the same effects.

According to Embodiments described above, the semiconductor devices include the printed circuit board and the semiconductor element 18. Here, the printed circuit board corresponds to, for example, any one of the printed circuit board 16, the printed circuit board 36, the printed circuit board 56, the printed circuit board 66, the printed circuit board 76, and the like (for convenience, any one of these may correspond to the printed circuit board described hereinafter). The printed circuit board 16 has a first circuit pattern and a second circuit pattern on the upper surface thereof. Here, the first circuit pattern corresponds to, for example, any one of the circuit pattern 16B, the wiring layer 36B, the via hole plating layer 36H, the wiring layer 36G, and the wiring layer 36J, and the like (for convenience, any one of these may correspond to the first circuit pattern described hereinafter). Also, the second circuit pattern corresponds to, for example, any one of the circuit pattern 16E and the circuit pattern 36D, and the like (for convenience, any one of these may correspond to the second circuit pattern described hereinafter). The semiconductor element 18 is arranged on the upper surface of the circuit pattern 16B. The drain electrode 18A is arranged on the upper surface of the semiconductor element 18. Further, the semiconductor element 18 has the gate electrode 18B and the source electrode 18C arranged on the lower surface thereof. The gate electrode 18B and the source electrode 18C are bonded to the upper surface of the circuit pattern 16B via a first bonding material. Here, the first bonding material corresponds to, for example, the bonding material 14B or the like. The drain electrode 18A is bonded to the upper surface of the second circuit pattern via a metal member connected to the upper surface of the semiconductor element 18. Here, the metal member corresponds to, for example, any one of the metal wire 20 and the metal block 110, and the like (for convenience, any one of these may correspond to the metal member described hereinafter). Also, the second circuit pattern corresponds to, for example, any one of the circuit pattern 16E and the circuit pattern 36D, and the like (for convenience, any one of these may correspond to the second circuit pattern described hereinafter).

According to such a configuration, the temperature rise of the semiconductor element 18 is suppressed. Specifically, since the drain electrode 18A is formed on the upper surface of the semiconductor element 18 to which the metal wire 20 (or the metal block 110) is connected, an area where the metal wire is bonded is made larger than in a case in which the metal wire 20 is connected to the surface on which the gate electrode 18B and the source electrode 18C are formed. Accordingly, the number of metal wires 20 to be wired on the surface increases (or the metal block 110 is connectable); therefore, the amount of heat generated by each metal wire 20 (or the metal block 110) is suppressed. In addition, the degree of freedom in the wiring position of the metal wires 20 is enhanced. As a result, even if the outer diameter size of the semiconductor element 18 is reduced for the purpose of improving yield (that is, the area of the source electrode is reduced), the temperature rise of the semiconductor element 18 due to the heat of the metal wires 20 is suppressed. Further, the source electrode 18C is connected to the circuit pattern 16B via the bonding material 14B; therefore, the temperature rise of the semiconductor element 18 is suppressed more than that in the case where the source electrode 18C is connected by the metal wire 20. Therefore, the temperature rise of the wiring is suppressed on the upper and lower surfaces of the semiconductor element 18, and as a result, the temperature rise of the semiconductor element 18 is suppressed.

It should be noted that, even if the other configurations illustrated herein is added to the configurations described above as appropriate, that is, even if other configurations not mentioned herein as the above configurations are appropriately added to the specification of the present application, the same effects can be produced.

Further, according to Embodiments described above, the printed circuit board 36 includes the insulating substrate 36A, the wiring layer arranged on the upper surface of the insulating substrate 36A, and the insulating layer 36C partially arranged on the upper surface of the wiring layer. Here, the wiring layer corresponds to, for example, any one of the wiring layer 36B, the wiring layer 36G, and the wiring layer 36J, and the like (for convenience, any one of these may correspond to the wiring layer described hereinafter). The first circuit pattern is part of the wiring layers 36B that are exposed at a plurality of locations without being covered by the insulating layers 36C. Further, the second circuit pattern is the circuit pattern 36D arranged on the upper layer of the insulating layer 36C. According to such a configuration, the reduction in the amount of wiring to be laid serving as the metal wire 20 for connection is ensured. Therefore, even if the outer diameter size of the semiconductor element 18 is reduced and a large number of semiconductor elements 18 are arranged in parallel, appropriate wiring with a high degree of freedom is performable without increasing the outer diameter size of the semiconductor device. As a result, the downsizing of the semiconductor device is implemented.

Further, according to Embodiments described above, the wiring layer 36G includes a via hole plating layer 36H provided at a position where at least one of the gate electrode 18B and the source electrode 18C is bonded to the wiring layer 36G via the bonding material 14B. According to such a configuration, when the semiconductor element 18 and the printed circuit board 56 are bonded, the bonding material 14B penetrates into the via hole of the via hole plating layer 36H. Therefore, the bonding area between the bonding material 14B and the via hole plating layer 36H increases, enabling to stabilize the bonding process. Further, suppression of the heat generation in the wiring of the semiconductor element 18 is ensured; therefore, the reliability of the semiconductor element is improved.

Further, according to Embodiments described above, the wiring layer 36J is exposed from the side surface of the insulating substrate 36A. The semiconductor device includes the metal terminal 24A bonded, via a second bonding material, to the wiring layer 36J exposed from the side surface of the insulating substrate 36A. Here, the second bonding material corresponds to, for example, the bonding material 14D or the like. According to such a configuration, the metal terminal 24A and the wiring layer 36J are connected via the bonding material 14D; therefore, the necessity to form a pattern for connecting the metal wires is eliminated. Therefore, a large area for mounting the semiconductor element 18 is secured, and the downsizing of the semiconductor device is implemented.

Further, according to Embodiments described above, the semiconductor device includes the heat radiating sheet 100 that adheres to the lower surface of the printed circuit board 66 (or the printed circuit board 76), and the base plate 12 that adheres to the lower surface of the heat radiating sheet 100. The heat radiating sheet 100 includes the first PET film, the graphite sheet 103, and the second PET film. Here, the first PET film corresponds to, for example, the PET film 102A. Also, the second PET film corresponds to, for example, the PET film 102B. The PET film 102A adheres to the lower surface of the printed circuit board 66 (or the printed circuit board 76) via a first adhesive. Here, the first adhesive corresponds to, for example, the acrylic adhesive 101A. The graphite sheet 103 is arranged on the lower surface of the PET film 102A. The PET film 103B is arranged on the lower surface of the graphite sheet 103. Further, the PET film 102B adheres to the upper surface of the base plate 12 via the second adhesive. Here, the second adhesive corresponds to, for example, the acrylic adhesive 101B. According to such a configuration, the heat radiation property of the semiconductor element 18 is improved. Therefore, even if the outer diameter size of the semiconductor element 18 is reduced, deterioration of the heat radiation property of the semiconductor element 18 is suppressed by dispersing the heat generated in the semiconductor element 18 by the graphite sheet 103.

Further, according to Embodiments described above, the printed circuit board 16 has the peeling intensity at 175° C. or higher is 70% or more of the peeling intensity at room temperature. According to such a configuration, the reliability of the semiconductor device in a high temperature environment is improved.

Further, according to Embodiments described above, the semiconductor element consists of SiC. According to such a configuration, the downsizing and the multiple parallelization of the semiconductor elements are implemented due to the property of SiC of being capable of operation at a higher temperature than that of Si or the like. As a result, the downsizing of the semiconductor device is implemented.

Further, according to Embodiments described above, the metal member is the metal wire 20. According to such a configuration, since the drain electrode 18A is formed on the upper surface of the semiconductor element 18 to which the metal wire 20 is connected, an area where the metal wire is bonded is made larger than in a case in which the metal wire 20 is connected to the surface on which the gate electrode 18B and the source electrode 18C are formed. Accordingly, the number of metal wires 20 to be wired on the surface increases; therefore, the amount of heat generated by each metal wire 20 is suppressed.

Further, according to Embodiments described above, the metal member is the metal block 110. According to such a configuration, the metal block 110 connected to the drain electrode 18A and the circuit pattern 36D has a larger bonding area than the metal wire; therefore, the heat radiation property of the semiconductor element 18 is improved. As a result, a design that increases the current density of the semiconductor element 18 is implemented.

Modification of Embodiments Described Above

Although in Embodiments described above, the texture, material, dimensions, shape, relative arrangement relationship or implementation conditions of each component may be described, these are examples in all aspects and are not limited to those described herein.

Accordingly, it is understood that numerous other modifications variations, and equivalents can be devised without departing from the scope of the invention. For example, Modification includes, modifying, adding or omitting at least one component, or extracting at least one component in at least one Embodiment and combining the component with the other components.

Further, in above-described Embodiments, when a material name or the like is described without being specified, the material contains other additives, for example, an alloy or the like, so far as consistent with Embodiments.

In addition, so far as consistent with Embodiments, in a component described that the number thereof to be provided is "one" in above-described Embodiments, the number thereof to be provided may be "one or more".

Furthermore, each component in Embodiments described above is a conceptual unit, and the scope of the technique disclosed in the present specification shall include the conditions, following: one component consists of a plurality of components, one component corresponds to a part of a structure, and further, a plurality of components are provided with one structure.

In addition, each component in above-described Embodiment shall include another structure or a structure having a shape as long as the same function is exhibited.

In addition, the description in the present specification is referred to for all purposes relating to the present technique, and does not acknowledge to be a prior art.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
    a printed circuit board including a first circuit pattern and a second circuit pattern; and
    a semiconductor element arranged on an upper surface of the first circuit pattern, wherein,
    in the semiconductor element, a drain electrode is arranged on an upper surface thereof and a gate electrode and a source electrode are arranged on a lower surface thereof,
    the gate electrode and the source electrode are bonded to the upper surface of the first circuit pattern via a first bonding material, and
    the drain electrode is bonded to an upper surface of the second circuit pattern via a metal member connected to the upper surface of the semiconductor element.

2. The semiconductor device according to claim 1, wherein
    the printed circuit board includes
        an insulating substrate,
        a wiring layer formed on an upper surface of the insulating substrate, and
        an insulating layer partially arranged on an upper surface of the wiring layer,
    the first circuit pattern is part of the wiring layers that are exposed at a plurality of locations without being covered by the insulating layers, and
    the second circuit pattern is arranged on an upper surface of the insulating layer.

3. The semiconductor device according to claim 2, wherein
    the wiring layer includes a plating layer at a position in which the wiring layer is bonded to at least one of the gate electrode and the source electrode via the first bonding material.

4. The semiconductor device according to claim 2, wherein
    the wiring layer is exposed from a side surface of the insulating substrate, and
    the semiconductor device further includes a metal terminal connected to the wiring layer exposed from the side surface of the insulating substrate via a second bonding material.

5. The semiconductor device according to claim 1, further comprising:
    a heat radiation sheet adheres to a lower surface of the printed circuit board; and
    a base plate adheres to a lower surface of the heat radiation sheet, wherein
    the heat radiation sheet includes
        a first PET film adheres to the lower surface of the printed circuit board via a first adhesive,
        a graphite sheet arranged on a lower surface of the first PET film, and
        a second PET film arranged on a lower surface of the graphite sheet and attached to an upper surface of the base plate via the second adhesive.

6. The semiconductor device according to claim 1, wherein
    the printed circuit board has a peeling intensity at 175° C. or higher is 70% or more of the peeling intensity at room temperature.

7. The semiconductor device according to claim 1, wherein
    the semiconductor element consists of SiC.

8. The semiconductor device according to claim 1, wherein
    the metal member includes a metal wire.

9. The semiconductor device according to claim 1, wherein
    the metal member includes a metal block.

* * * * *